United States Patent
Tang

(10) Patent No.: US 9,484,950 B1
(45) Date of Patent: Nov. 1, 2016

(54) HARDWARE EFFICIENT DIGITAL SIGNAL PROCESSING FOR ON-THE-FLY DELTA SIGMA BIT STREAM LINEAR OPERATOR AND COMPRESSOR CIRCUITS

(71) Applicant: Arrowhead Center, Inc., Las Cruces, NM (US)

(72) Inventor: Wei Tang, Las Cruces, NM (US)

(73) Assignee: Arrowhead Center, Inc., Las Cruces, NM (US)

( * ) Notice: Subject to any disclaimer, the term of this patent is extended or adjusted under 35 U.S.C. 154(b) by 0 days.

(21) Appl. No.: 14/924,305

(22) Filed: Oct. 27, 2015

Related U.S. Application Data

(60) Provisional application No. 62/120,697, filed on Feb. 25, 2015, provisional application No. 62/069,232, filed on Oct. 27, 2014.

(51) Int. Cl.
  *H03M 3/00* (2006.01)
  *H03M 7/30* (2006.01)

(52) U.S. Cl.
  CPC .......... *H03M 7/3004* (2013.01); *H03M 3/30* (2013.01); *H03M 3/468* (2013.01)

(58) Field of Classification Search
  CPC ..... H03M 7/3004; H03M 3/468; H03M 3/30
  USPC ........................................................ 341/143
  See application file for complete search history.

(56) References Cited

U.S. PATENT DOCUMENTS

| | | |
|---|---|---|
| 5,150,324 A * | 9/1992 | Takasuka ............... G06G 7/161 708/3 |
| 5,200,750 A | 4/1993 | Fushiki et al. |
| 5,349,353 A | 9/1994 | Zrilic |
| 5,392,040 A * | 2/1995 | Hayashi ............. H03M 7/3015 341/143 |
| 5,990,818 A | 11/1999 | McGrath |
| 6,150,969 A | 11/2000 | Melanson |
| 6,285,306 B1 | 9/2001 | Zrilic |
| 6,362,762 B1 | 3/2002 | Jensen et al. |
| 6,437,718 B1 | 8/2002 | Oyama et al. |
| 6,668,035 B2 | 12/2003 | Han et al. |

(Continued)

FOREIGN PATENT DOCUMENTS

| | | |
|---|---|---|
| CA | 2003428 | 12/1999 |
| ES | 2264871 B1 | 12/2007 |
| WO | 2010119456 A2 | 10/2010 |

OTHER PUBLICATIONS

"AD7398/7399 Quad, Serial Input 12-Bit/10Bit DAC's", Analog Devices, Tech. Rep, 2011.

(Continued)

*Primary Examiner* — Brian Young
(74) *Attorney, Agent, or Firm* — Jeffrey D. Myers; Peacock Myers, P.C.

(57) ABSTRACT

Methods and apparatuses embodied in delta sigma domain digital signal processing circuits that perform linear operation of delta sigma modulated bit stream, including adding, coefficient multiplication, and compressing. The digital processing circuits perform on-the-fly processing to generate a continuous output delta sigma bit-stream based on the continuous input delta-sigma modulated bit-streams and the input binary coefficients. The on-the-fly bit-stream processing circuit is realized via digital delta sigma modulators with input coefficient multiplexers, feedback multiplexers, and toggling multiplexers.

22 Claims, 3 Drawing Sheets

*Digital Delta Sigma Linear Operator*

(56) References Cited

U.S. PATENT DOCUMENTS

| | | | |
|---|---|---|---|
| 7,190,288 B2* | 3/2007 | Robinson | H03M 7/3015 341/106 |
| 7,245,246 B2 | 7/2007 | Ihs et al. | |
| 7,321,325 B2 | 1/2008 | Hsieh et al. | |
| RE40,424 E | 7/2008 | Han et al. | |
| 7,696,913 B2 | 4/2010 | Melanson | |
| 8,164,491 B2 | 4/2012 | Cho et al. | |
| 8,193,845 B2 | 6/2012 | Jian et al. | |
| 8,542,138 B2 | 9/2013 | Galton et al. | |
| 8,581,763 B2 | 11/2013 | Niwa et al. | |
| 8,581,764 B2 | 11/2013 | Moue | |
| 8,842,030 B1 | 9/2014 | Fontaine et al. | |
| 2003/0108143 A1 | 6/2003 | Han et al. | |
| 2004/0223553 A1 | 11/2004 | Kumar | |
| 2005/0068213 A1 | 3/2005 | Fontaine et al. | |
| 2011/0140940 A1 | 6/2011 | Cho et al. | |
| 2014/0368366 A1 | 12/2014 | Galton et al. | |

OTHER PUBLICATIONS

"AD7401 Isolated Sigma-Delta Modulator", Analog Devices, Tech. Rep., 2011.

"ADS131E04 Analog Front-End for Power Monitoring, Control and Protection", Texas Instruments, Tech. Rep, 2013.

"Opal Kelly XEM 3001 User's Manual", Opal Kelly Incorporated, 2004.

Andersson, "Continuous-Time Delta-Sigma Modulators for Wireless Communication", Lund Institute of Technology, 2014.

Cherry, et al., "Continuous-Time Delta-Sigma Modulators for High-Speed A/D Conversion", Kluwer Academic Publishers, 2002.

Dias, "Signal Processing in the Sigma-Delta Domain", Microelectronics Journal, 1995, 543-562.

Fujisaka, et al., "Bit-Stream Signal Processing and Its Application to Communication Systems", Circuits, Devices and Systems, 2002, 159-166.

Fujisaka, et al., "Sequence Characteristics of Multi-Level and Second-Order Sigma-Delta Modulated Signals", Nonlinear Theory and Its Applications, IEICE, Jul. 1, 2013, 313-339.

Fujisaka, et al., "Sorter-Based Arithmetic Circuits for Sigma-Delta Domain Signal Processing—Part II: Multiplication and Algebraic Functions", Transactions on Circuits and Systems I: Regular Papers, IEEE, Sep. 2012, 1966-1979.

Fujisaka, et al., "Sorter-Based Arithmetic Circuits for Sigma-Delta Domain Signal Processing-Part I; Addition, Approximate Transcendental Functions, and Log-Domain Operations", Transactions on Circuits and Systems I: Regular Papers, IEEE, Sep. 2012, 1952-1965.

Hidaka, et al., "Piecewise Linear Operations on Sigma-Delta Modulated Signals", vol. 3, 2002, 983-986.

Horianopoulos, et al., "Design Technique for Hardware Reduction in Delta Modulation FIR Filters", International Journal of Electronics, 1991, 93-106.

Johns, et al., "Design and Analysis of Delta-Sigma Based IIR Filters", IEEE Transactions on Circuits and Systems-II: Analog and Digital Signal Processing, Apr. 1993, 233.

Katao, et al., "Single-Electron Arithmetic Circuits for Sigma-Delta Domain Signal Processing", Nanotechnology NANO 2008. 8th IEEE Conference on Aug. 2008, 729-732.

Kouvaras, et al., "A Technique for a Substantial Reduction of the Quantization Noise in the Direct Processing of Delta-Modulated Signals", Signal Processing, 1985, 107-119.

Kouvaras, "Modular network for direct complete addition of delta-modulated signals with minimum quantization error", Int. J. Electronics, 1985, 587-595.

Kouvaras, "Modular Network for Direct Complete Addition of Delta-Modulated Signals with Minimum Quantization Error", International Journal of Electronics, 1985, 587-595.

Kouvaras, "Operations on Delta-Modulated Signals and Their Application in the Realization of Digital Filters", Radio and Electronic Engineer, Sep. 1978, 431-438.

Kouvaras, "Some Novel Elements for Delta-Modulated Signal Processing", Radio and Electronic Engineer, May 1981 241-250.

Li, "Design of Multi-bit Sigma-Delta Modulators for Digital Wireless Communications", Kungl Royal Institute of Technology Department of Microelectronics & Information Technology, 2003.

Liang, et al., "Design of High Speed High SNR Bit-Stream Adder Based on Delta-Sigma Modulation", Electronics Letters, May 2010, 752-753.

Matsuyama, et al., "Arithmetic and Piecewise Linear Circuits for Sigma-Delta Domain Multi-Level Signal Processing", International Symposium on Nonlinear Theory and its Applications. (NOLTA 2005), Oct. 2005, 58-61.

Moule, et al., "Blue-Noise Sigma-Delta Modulator: Improving Substrate Noise and Nonlinear Amplifier Gain Effects", Dept. of Electrical and Computer Engineering University of Rochester Rochester, NY USA.

Ng, et al., "Bit-Stream Adders and Multipliers for Tri-Level Sigma-Delta Modulators", Transactions on Circuits and Systems II: Express Briefs, IEEE, Dec. 2007, 1082-1086.

O'Leary, et al., "Bit Stream Adder for Oversampling Coded Data", Joanneum Research, Aug. 6, 1990.

Park, "Principles of Sigma-Delta Modulation for Analog-to-Digital Converters", Motorola Digital Signal Processors.

Pavan, et al., "A Power Optimized Continuous-Time $\Delta\Sigma$ADC for Audio Applications", IEEE Journal of Solid-State circuits, Feb. 2008.

Pneumatikakis, et al., "Realization of a high-order IIR delta signma filter", Int. J. Electronics, 1995, 1071-1089.

Pneumatikakis, et al., "Realization of a High-Order IIR Delta-Sigma Filter", International Journal of Electronics, 1995, 1071-1089.

Schreier, "De;ta Sigma Toolbox", http://www.mathwords.com/matlabcentral/fileexchange/19-delta-sigma toolbox, Dec. 2011.

Tang, "Hardware Efficient Digital Signal Processing Methods for Implementation of On-the Fly Delta Sigma Adder and compressor Circuits", Klipsch School of Electrical and Computer Engineering, New Mexico State University wtang@nmsu.edu.

Yoo, et al., "An 8-Channel Scalable EEG Acquisition SoC with Fully Integrated Patient-Specific Seizure Classification and Recording Processor", Solid-State Circuits Conference Digest of Technical Papers (ISSCC) IEEE International, Feb. 2012, 292-294.

Yoo, et al., "An 8-Channel Scalable EEG Acquisition SoC with Patient-Specific Seizure Classification and Recording Processor", Solid-State Circuits, IEEE Journal, Jan. 2013, 214-228.

* cited by examiner

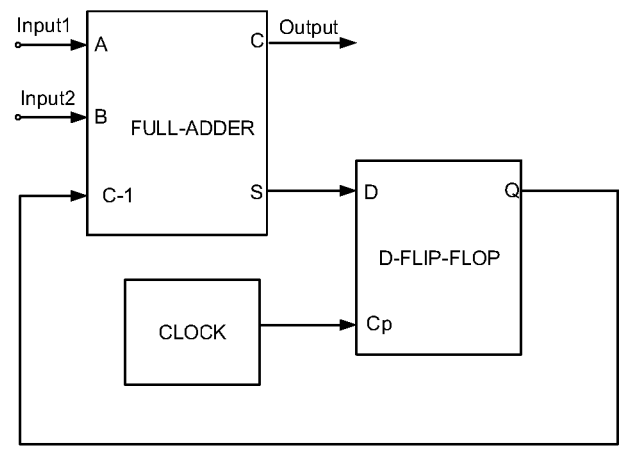
Fig. 1  Delta Sigma Adder (Prior Art)
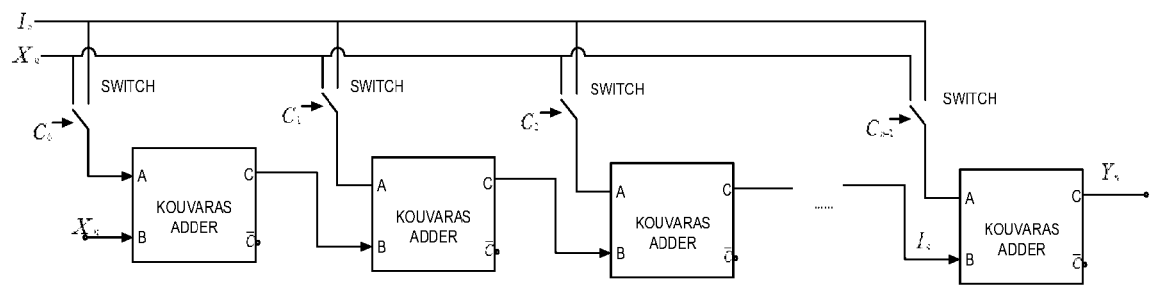
Fig. 2  Delta Sigma Coefficient Multiplier (Prior Art)

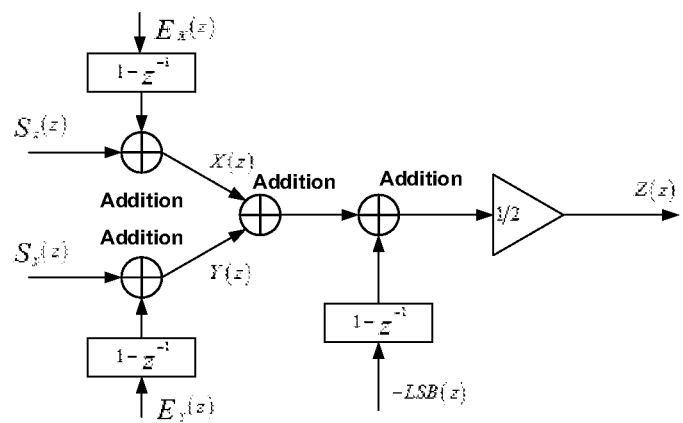
Fig. 3  Delta Sigma Adder (Prior Art)
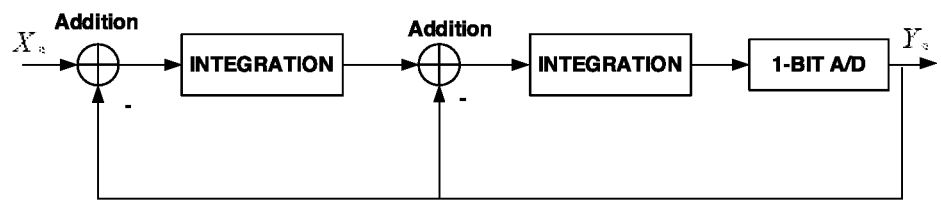
Fig. 4  Delta Sigma Multiplier (Prior Art)
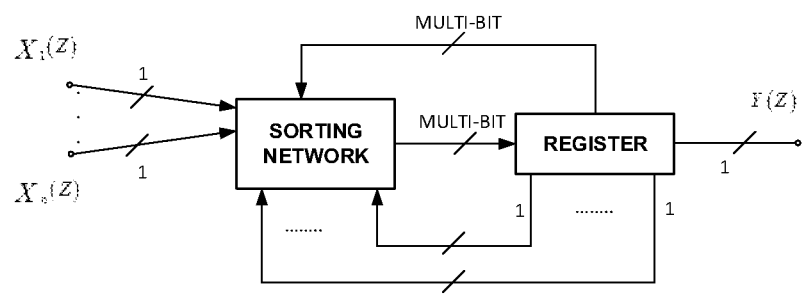
Fig. 5  Delta Sigma Adder (Prior Art)

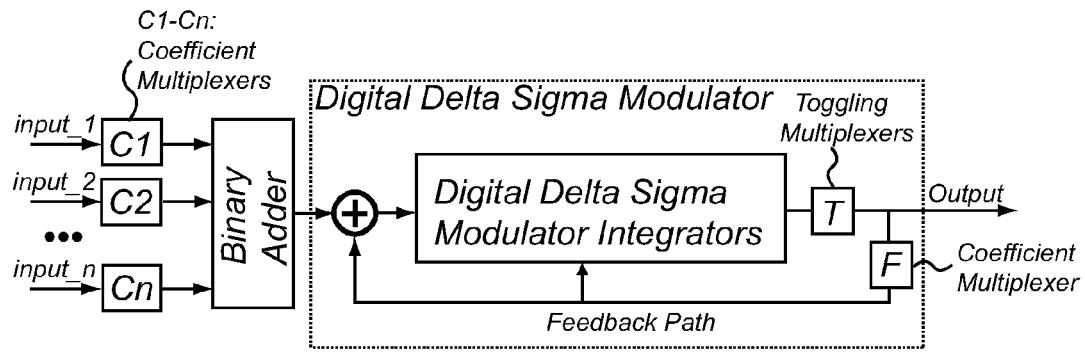
Fig. 6  Digital Delta Sigma Linear Operator
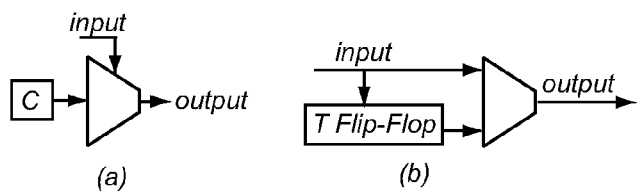
Fig. 7  (a) Coefficient Multiplexer
(b) Toggling Multiplexer
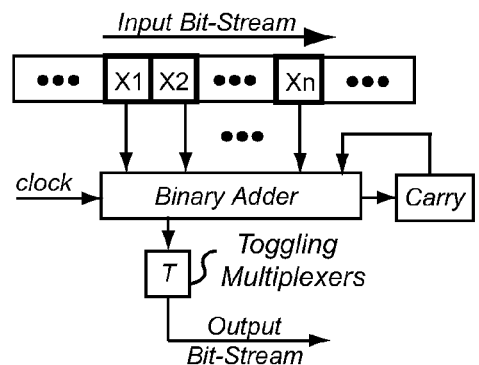
Fig. 8  Delta Sigma Bit Stream Compressor

HARDWARE EFFICIENT DIGITAL SIGNAL PROCESSING FOR ON-THE-FLY DELTA SIGMA BIT STREAM LINEAR OPERATOR AND COMPRESSOR CIRCUITS

CROSS-REFERENCE TO RELATED APPLICATIONS

This application claims priority to and the benefit of the filing of U.S. Provisional Patent Application Ser. No. 62/120,697, entitled "Hardware Efficient Digital Signal Processing for On-The-Fly Delta Sigma Adder and Compressor Circuits", filed on Feb. 25, 2015, and U.S. Provisional Patent Application No. 62/069,232, entitled "Non-Weighted Digital Signal Processing for Wearable Medical Devices", filed Oct. 27, 2014, and the specifications thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to the field of digital signal processing.

Delta Sigma technology has been widely used in converting analog signals to digital signals, it has not been commonly applied in digital signal processing, because of the lack of Delta Sigma based linear processing circuits. Here, this invention is directed to an alternative method using a 1-bit DSP system to process Delta Sigma bit-streams directly.

2. Description of Related Art

In digital signal processing systems, the most important linear circuits are adders, coefficient multipliers, and compressors. To build those circuits with low noise and complexity, pure digital implementations are preferable. However, some previous Delta Sigma processing methods focused on modifying the Delta Sigma modulators, J. Melanson, "Signal processing system using delta-sigma modulation having an internal stabilizer path with direct output-to-integrator connection," U.S. Pat. No. 7,696,913, 2010; J. Choi, S. Han, J. Jang, and H. Yu, "Structure of delta-sigma fractional divider," U.S. Patent Publication No. 2003/0108143; M. Cho, Y. Kim, and J. Kwon, "Coefficient multiplier and digital delta sigma modulator using the same," U.S. Patent Publication No. 2011/0140940, instead of processing the modulated bit-stream. Moreover some solutions are hindered by involving analog operations, A. Niwa and Y. Ueno, "Delta-sigma modulator and signal processing system," U.S. Pat. No. 8,581,763, 2013; T. Moue, "Delta-sigma modulator and signal processing system," U.S. Pat. No. 8,581,764, 2013; V. F. Dias, "Signal processing in the sigma-delta domain," Microelectron. J., vol. 26, pp. 543-562, 1995, or tri-state digital circuits, C.-W. Ng, N. Wong, and T.-S. Ng, "Bit-stream adders and multipliers for tri-level sigma delta modulators," Circuits and Systems II: Express Briefs, IEEE Transactions on, vol. 54, no. 12, pp. 1082-1086, December 2007, which increase the complexity of the circuits. Other designs are impeded by their ability of processing only first-order Delta Sigma bit-streams, N. Kouvaras, "Operations on delta-modulated signals and their application in the realization of digital filters," Radio and Electronic Engineer, vol. 48, no. 9, pp. 431-438, September 1978; N. Kouvaras, "Some novel elements for delta-modulated signal processing," Radio and Electronic Engineer, vol. 51, no. 5, pp. 241-250, May 1981; N. Kouvaras and J. Karakatsanis, "A technique for a substantial reduction of the quantization noise in the direct processing of delta-modulated signals," Signal Processing, vol. 8, no. 1, pp. 107-119, 1985; N. Kouvaras, "Modular network for direct complete addition of delta modulated signals with minimum quantization error," International Journal of Electronics, vol. 59, no. 5, pp. 587-595, 1985; H. Fujisaka, R. Kurata, M. Sakamoto, and M. Morisue, "Bit-stream signal processing and its application to communication systems," Circuits, Devices and Systems, IEE Proceedings, vol. 149, no. 3, pp. 159-166, 2002; K. Matsuyama, H. Fujisaka, and T. Kamino, "Arithmetic and piecewise linear circuits for sigma-delta domain multi-level signal processing," in 2005 International Symposium on Nonlinear Theory and its Applications (NOLTA 2005), October 2005, pp. 58-61; Y. Hidaka, H. Fujisaka, M. Sakamoto, and M. Morisue, "Piecewise linear operations on sigma-delta modulated signals," in Electronics, Circuits and Systems, 2002. 9th International Conference on, vol. 3, 2002, pp. 983-986 vol. 3; D. Zrilic, "Method and apparatus for mixed analog and digital processing of delta modulated pulse streams including digital-to-analog conversion of a digital input signal," U.S. Pat. No. 5,349,353, 1994; D. Zrilic, "Circuits and methods for functional processing of delta modulated pulse density stream," U.S. Pat. No. 6,285,306, 2001; S. Horianopoulos, V. Anastassopoulos, and T. Deliyannis, "Design technique for hardware reduction in delta modulation fir filters," International Journal of Electronics, vol. 71, no. 1, pp. 93-106, 1991; A. Pneumatikakis, V. Anastassopoulos, and T. Deliyannis, "Realization of a high-order iir delta sigma filter," International Journal of Electronics, vol. 78, no. 6, pp. 1071-1089, 1995; P. O'Leary and F. Maloberti, "Bit stream adder for oversampling coded data," Electronics Letters, vol. 26, no. 20, pp. 1708-1709, September 1990; Y. Liang, Z. Wang, Q. Meng, and X. Guo, "Design of high speed high SNR bit-stream adder based on delta sigma modulation," Electronics Letters, vol. 46, no. 11, pp. 752-753, May 2010; D. McGrath, "Method and apparatus for processing sigma-delta modulated signals," U.S. Pat. No. 5,990,818, 1999, which do not fit the widely used higher-order Delta Sigma modulators. Furthermore adders in Kouvaras can only take two inputs. So far the most promising structure of processing higher-order Delta Sigma bit-stream is the digital Delta Sigma modulator proposed by Fujisaka et al. in H. Fujisaka, M. Sakamoto, C.-J. Ahn, T. Kamio, and K. Haeiwa, "Sorter based arithmetic circuits for sigma-delta domain signal processing—part ii: Multiplication and algebraic functions," Circuits and Systems I: Regular Papers, IEEE Transactions on, vol. 59, no. 9, pp. 1966-1979, September 2012. Although that system has achieved higher-order noise shaping with high signal-to-noise-plus-distortion-ratio (SNDR), the complicated sorting network in Fujisaka et al. requires a great amount of circuit resources, which may work better with future quantum device. T. Katao, Y. Suzuki, H. Fujisaka, T.

Kamio, C.-J. Ahn, and K. Haeiwa, "Single-electron arithmetic circuits for sigma-delta domain signal processing," in Nanotechnology, 2008. NANO '08. 8th IEEE Conference on, August 2008, pp. 729-732.

The Delta Sigma average adder proposed by N. Kouvaras [N. Kouvaras, "Operations on delta-modulated signals and their application in the realization of digital filters," Radio and Electronic Engineer, vol. 48, no. 9, pp. 431-438, September 1978] is shown in FIG. 1. It uses a binary full adder with switched role of sum and carry output. It can take only two inputs. The analog value of the output bit stream is the average value of the two input bit stream, instead of the sum.

The Delta Sigma coefficient multiplier [N. Kouvaras, "Operations on delta-modulated signals and their application in the realization of digital filters," Radio and Electronic Engineer, vol. 48, no. 9, pp. 431-438, September 1978] based on the average adder is shown in FIG. 2.

The tri-state Delta Sigma adder [IEEE Transactions on Circuits and Systems II: Express Briefs, vol. 54, no. 12, pp. 1082-1086, December 2007] is shown proposed by Chiu-Wa Ng. et al. is shown in FIG. 3. The circuit uses tri-state digital signals, which is not well compatible with current bi-state digital technology.

The digital Delta Sigma modulator proposed by David A. Johns [David A. Johns and David M. Lewis: Design and Analysis of Delta Sigma Based IIR Filter, IEEE Transactions on Circuits and Systems II: Analog and Digital Signal Processing. Vol. 40, No. 4, April 1993, pp. 233-240] is shown in FIG. 4. The main application is digital filtering. The digital Delta Sigma modulator does not have a toggling multiplexer thus the output noise is high.

The Delta Sigma adder based on sorting network proposed by Fujisaka et. al., [H. Fujisaka, M. Sakamoto, C.-J. Ahn, T. Kamio, and K. Haeiwa, "Sorter based arithmetic circuits for sigma-delta domain signal processing—part ii: Multiplication and algebraic functions," Circuits and Systems I: Regular Papers, IEEE Transactions on, vol. 59, no. 9, pp. 1966-1979, September 2012.] is shown in FIG. 5. The circuit uses complex sorting networks.

BRIEF SUMMARY OF THE INVENTION

The present invention includes methods and apparatus embodied on delta sigma domain digital signal processing circuits. The invention can perform linear operation of delta sigma modulated bit stream, including adding, coefficient multiplication, and compressing. The inventive digital processing circuits can perform on-the-fly processing to generate a continuous output delta sigma bit-stream based on the continuous input delta-sigma modulated bit-streams and the input binary coefficients. The on-the-fly bit-stream processing circuit is realized on input coefficient multiplexers, feedback multiplexers, and toggling multiplexers.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 1 (prior art) shows a Delta Sigma average adder;

FIG. 2 (prior art) shows a Delta Sigma coefficient multiplier based on average adder;

FIG. 3 (prior art) shows a Delta Sigma adder based on tri-state digital circuits;

FIG. 4 (prior art) shows a Delta Sigma multiplier based on digital Delta Sigma modulator;

FIG. 5 (prior art) shows a Delta Sigma adder based on sorting network;

FIG. 6 presents simplified schematics of the Digital Delta Sigma Linear Operator of the invention;

FIGS. 7(a) and 7(b) show coefficient multiplexer and toggling multiplexer circuits in the Delta Sigma linear operator circuit of the invention; and FIG. 8 is a simplified circuit schematic of the Delta Sigma compressor of the invention.

SUMMARY OF THE INVENTION

The invention can perform the four arithmetic operations on the analog value of delta-sigma modulated bit-sequences, or adjust the length of a delta-sigma modulated bit-sequence. The invention can perform adding, coefficient multiplying, and compressing. In the adding operation, the analog value of the output bit-stream is a sum or difference of the analog values of all the input delta-sigma bit streams. In the coefficient multiplying operation, the analog value of the output bit-stream is the product of the analog value of the input stream and the input binary coefficient. In the compressing operation, the analog value of the output bit-stream is the same as the analog value of the input bit-stream, with a decreased resolution. The bit rate of the output bit-stream is lower than the bit rate of the input bit-stream. The on-the-fly bit-stream processing circuit is realized on input coefficient multiplexers, feedback multiplexers, and toggling multiplexers.

Previously known Delta Sigma digital signal processing circuits are more complex to be realized in hardware, hence consumes more power and circuit area when integrated on chip. In this invention, the signal processing method is based on the optimization of the hardware performance. The invention can be used to create all linear digital processing elements such as the Finite Impulse Response (FIR) filters and the Infinite Impulse Response (IIR) filters. Compared to the binary systems, the delta-sigma system has higher resolution, higher reliability, lower circuit complexity, and lower power consumption, with the cost of lower speed and higher data size. Since biomedical signals are low speed and usually wearable devices do not require raw data recording, the inventive method and device can be widely used in wearable and implantable devices.

DETAILED DESCRIPTION OF THE INVENTION

The invention is of hardware efficient Delta Sigma signal processing methods and circuits. The invention employs digital delta sigma modulation method with coefficient multiplexers and toggling multiplexers. Based on those methods, this invention develops several Delta Sigma domain on-the-fly digital-signal-processing circuits, including the Delta Sigma adders, coefficient multipliers, and compressors.

Delta Sigma Bit-Stream Linear Operator Circuits

In Delta Sigma processing, an adder generates a new delta sigma bit stream based on the input bit-streams. The analog value of the adder output bit-stream is equal to the sum of the analog values of the addend bit-streams. A coefficient multiplier generates a new delta sigma bit stream based on the input bit stream and a binary multi bit coefficient. The analog value of the coefficient multiplier output bit stream is equal to the product of the analog value of the input bit stream and the coefficient.

A schematic of the Delta Sigma linear operator is shown in FIG. 6. Input signals, from input_1 to input_n are delta sigma bit streams generated from delta sigma modulators. Besides input signals, other signals in the digital delta sigma linear modulators are signed binary numbers. Each input signal is processed by a coefficient multiplexer with individual coefficients from C1 to Cn. A binary adder adds the results from coefficient multiplexers. The result is the input of a digital delta sigma modulator. The digital delta sigma modulator consists integrator chains and feedback path. The digital delta sigma modulator can be different topologies depends on feedback and feed-forward paths. The digital delta sigma modulator integrator chain precedes a toggling multiplexer T and a feedback coefficient multiplexer F. The feedback coefficient multiplexer applies a coefficient F. Coefficients in coefficient multiplexers are multi-bit binary data. With such topology, the analog value of the output bit stream is $$\text{Output} = \frac{C1}{F} \cdot \text{input\_1} + \frac{C2}{F} \cdot \text{input\_2} + \ldots + \frac{Cn}{F} \cdot \text{input\_n} \quad (1)$$

where input_1 to input_n denote the analog value of input delta sigma bit streams. The coefficient multiplexers are optional, which depends on specific applications. If all coefficient multiplexer, including C1 to Cn, and F is removed (or bypassed) in the circuit, the linear operator circuit becomes an adder, the analog value of the output bit stream is $$\text{Output} = \text{input\_1} + \text{input2} + \ldots + \text{input\_}n \quad (2)$$

In a coefficient multiplier, only one input bit stream and one coefficient multiplexer are necessary. By removing other input bit streams and coefficient multiplexers, the analog value of the output bit stream is $$\text{Output} = \frac{C1}{F} \cdot \text{input\_1} \quad (3)$$

The coefficient multiplexer used in the digital delta sigma linear operator circuit is illustrated in FIG. 7(a). The input signal is a single bit binary signal. The output is a multi bit signed binary signal. The output value depends on the input bit polarity and the coefficient. When input is bit 1 or positive value, the output is the same as coefficient C, otherwise the output takes the value of a negated C.

$$\text{Output} = \begin{cases} C \mid_{input=1} \\ -C \mid_{input=\phi} \end{cases} \quad (4)$$

The toggling multiplexer used in the digital delta sigma linear operator circuit is shown in FIG. 7(b). The input signal is a multi bit signed binary digital signal. The output signal is a single bit digital signal. If the input binary signal is not zero, then the output takes the sign of the input. If the input signal is zero, then the output takes the value from a toggling bit T, and T toggles for the next cycle, i.e., T=NOT(T).

$$\text{Output} = \begin{cases} 1 \mid_{input>\phi} \\ T \mid_{input=\phi}, T <= \overline{T} \\ 0 \mid_{input<\phi} \end{cases} \quad (5)$$

Delta Sigma Compressor Circuits

A Delta Sigma bit stream compressor circuit is illustrated in FIG. 8. The compressor generates an output bit stream with a lower bit rate. Assume the input bit stream coming into the compressor at a data rate of f, and the output bit stream has a data rate of f/n. The f/n is the clock of the compressor, at each clock cycle, n bit from the input bit stream will be added in the binary adder, the result is preceded by a toggling multiplexer, the output of the toggling multiplexer is the output of the delta sigma bit stream compressor, which has the same analog value of the input bit stream but with a lower data rate of f/n compared to the input bit stream with data rate f. The result from the adder is stored in a memory Carry, which will be used in the process of the next clock cycle.

While the preferred embodiment of the invention is directed to wearable medical devices, the invention is also useful in other applications usefully employing on-the-fly processing. The invention provides a systematic solution for the processing of non-weighted delta sigma bit streams. It is fully digital and can be implemented on integrated circuits easily with standard design and fabrication technology. The invention exercises much less circuit area and power consumption than current binary systems. Compared to the current binary systems, this invention also offers a higher resolution and higher reliability, with the cost of lower speed and a larger data size, which is not important in wearable and implantable devices.

In the preferred embodiment, and as readily understood by one of ordinary skill in the art, the apparatus according to the invention will include a general or specific purpose computer or distributed system programmed with computer software implementing the steps described above, which computer software may be in any appropriate computer language, including C++, FORTRAN, BASIC, Java, assembly language, microcode, distributed programming languages, etc. The apparatus may also include a plurality of such computers/distributed systems (e.g., connected over the Internet and/or one or more intranets) in a variety of hardware implementations. For example, data processing can be performed by an appropriately programmed microprocessor, computing cloud, Application Specific Integrated Circuit (ASIC), Field Programmable Gate Array (FPGA), or the like, in conjunction with appropriate memory, network, and bus elements.

Note that in the specification and claims, "about" or "approximately" means within twenty percent (20%) of the numerical amount cited. All computer software disclosed herein may be embodied on any non-transitory computer-readable medium (including combinations of mediums), including without limitation CD-ROMs, DVD-ROMs, hard drives (local or network storage device), USB keys, other removable drives, ROM, and firmware.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A digital signal processing apparatus comprising:
   a delta sigma modulated bit-stream linear operator circuit;
   a digital delta sigma modulator;
   a delta sigma summer or weighted summer;
   a delta sigma coefficient multiplier;
   a delta sigma compressing circuit; and
   a linear operator used as a bit stream weighted summer by enabling input coefficient multiplexers, a feedback multiplexer, and a toggling multiplexer or as a bit stream coefficient multiplier by enabling an input coefficient multiplexer, a feedback multiplexer, and a toggling multiplexer;
   wherein said apparatus generates a continuous output bit-stream based on continuous input delta-sigma modulated bit-streams and input binary coefficients or a predefined clock ratio.

2. The apparatus of claim 1 comprising a linear operator used as a bit stream weighted summer by enabling input coefficient multiplexers, a feedback multiplexer, and a toggling multiplexer.

3. The apparatus of claim 2 wherein an analog value of the output bit-stream is a sum or difference of analog values of all the input delta-sigma modulated bit streams when a coefficient multiplexer and a feedback multiplexer are by-passed.

4. The apparatus of claim 1 comprising a linear operator used as a bit stream coefficient multiplier by enabling an input coefficient multiplexer, a feedback multiplexer, and a toggling multiplexer.

5. The apparatus of claim 4 wherein an analog value of the output bit-stream is the product of an analog value of an input stream and an input binary coefficient.

6. The apparatus of claim 1 comprising a compressor.

7. The apparatus of claim 6 wherein an analog value of the output bit-stream is the same as an analog value of an input bit-stream, but with a decreased data rate.

8. The apparatus of claim 7 wherein decreased resolution results from decreased bit-stream lengths from input to output.

9. The apparatus of claim 1 embodied within a wearable or implantable medical device.

10. A digital signal processing method comprising the steps of:
    operating a delta sigma modulated bit-stream linear operator circuit;
    operating a digital delta sigma modulator;
    operating a delta sigma summer or weighted summer;
    operating a delta sigma coefficient multiplier;
    operating a delta sigma compressing circuit; and
    using a linear operator as a bit stream weighted summer by enabling input coefficient multiplexers, a feedback multiplexer, and a toggling multiplexer or as a bit stream coefficient multiplier by enabling an input coefficient multiplexer, a feedback multiplexer, and a toggling multiplexer;
    wherein the method generates a continuous output bit-stream based on continuous input delta-sigma modulated bit-streams and input binary coefficients or a predefined clock ratio.

11. The method of claim 10 comprising using a linear operator as a bit stream weighted summer by enabling input coefficient multiplexers, a feedback multiplexer, and a toggling multiplexer.

12. The method of claim 11 wherein an analog value of the output bit-stream is a sum or difference of analog values of all the input delta-sigma modulated bit streams when a coefficient multiplexer and a feedback multiplexer are bypassed.

13. The method of claim 10 comprising using a linear operator as a bit stream coefficient multiplier by enabling an input coefficient multiplexer, a feedback multiplexer, and a toggling multiplexer.

14. The method of claim 13 wherein an analog value of the output bit-stream is the product of an analog value of an input stream and an input binary coefficient.

15. The method of claim 10 additionally comprising using a compressor.

16. The method of claim 15 wherein an analog value of the output bit-stream is the same as an analog value of an input bit-stream, but with a decreased data rate.

17. The method of claim 16 wherein decreased resolution results from decreased bit-stream lengths from input to output.

18. The method of claim 10 comprising employing the method within a wearable or implantable medical device.

19. A digital signal processing apparatus comprising:
    a delta sigma modulated bit-stream linear operator circuit;
    a digital delta sigma modulator;
    a delta sigma summer or weighted summer;
    a delta sigma coefficient multiplier;
    a delta sigma compressing circuit; and
    a compressor;
    wherein said apparatus generates a continuous output bit-stream based on continuous input delta-sigma modulated bit-streams and input binary coefficients or a predefined clock ratio and wherein an analog value of the output bit-stream is the same as an analog value of an input bit-stream, but with a decreased data rate.

20. The apparatus of claim 19 wherein decreased resolution results from decreased bit-stream lengths from input to output.

21. A digital signal processing method comprising the steps of:
    operating a delta sigma modulated bit-stream linear operator circuit;
    operating a digital delta sigma modulator;
    operating a delta sigma summer or weighted summer;
    operating a delta sigma coefficient multiplier;
    operating a delta sigma compressing circuit; and
    using a compressor;
    wherein the method generates a continuous output bit-stream based on continuous input delta-sigma modulated bit-streams and input binary coefficients or a predefined clock ratio and wherein an analog value of the output bit-stream is the same as an analog value of an input bit-stream, but with a decreased data rate.

22. The method of claim 21 wherein decreased resolution results from decreased bit-stream lengths from input to output.

* * * * *